(12) United States Patent
Brown

(10) Patent No.: US 6,529,564 B1
(45) Date of Patent: Mar. 4, 2003

(54) DATA PULSE RECEIVER

(75) Inventor: Anthony K. D. Brown, Kanata (CA)

(73) Assignee: Nortel Networks Limited, St. Laurent (CA)

( * ) Notice: Subject to any disclaimer, the term of this patent is extended or adjusted under 35 U.S.C. 154(b) by 0 days.

(21) Appl. No.: 09/238,893

(22) Filed: Jan. 28, 1999

(51) Int. Cl.[7] .............................................. H04B 13/02
(52) U.S. Cl. ...................................... 375/318; 375/317
(58) Field of Search ................................ 375/318, 317, 375/359, 361, 316; 327/65, 52, 50, 56; 330/252; 341/69

(56) References Cited

U.S. PATENT DOCUMENTS

| | | | | |
|---|---|---|---|---|
| 4,823,360 A | * | 4/1989 | Tremblay et al. | 375/214 |
| 5,568,082 A |   | 10/1996 | Hedberg | 327/437 |
| 5,832,039 A | * | 11/1998 | Rijns | 375/317 |
| 5,852,637 A |   | 12/1998 | Brown et al. | 375/316 |
| 6,058,144 A | * | 5/2000 | Brown | 375/316 |
| 6,191,879 B1 | * | 2/2001 | Yanagisawa | 359/194 |

FOREIGN PATENT DOCUMENTS

| | | | |
|---|---|---|---|
| GB | 0 955 728 A2 | 10/1999 | H03K/3/037 |
| WO | WO 96/19042 | 6/1996 | H03K/3/2897 |
| WO | WO 99/52207 | 10/1999 | H03F/3/45 |

* cited by examiner

Primary Examiner—Phuong Phu

(57) ABSTRACT

A data pulse receiver includes a data regenerator and a peak detector, both having set-reset flip-flops (RS-FFs) to generate hysteresis which is varied based on its tail current provided to the RS-FF. The regenerator regenerates data from a differential signal derived from an incoming data signal. The peak detector monitors the peak level of the differential signal derived and its output adjust automatically the tail currents of the data regenerator and the peak detector. The receiver also includes impedance matching networks connected to the data regenerator and the peak detector. The input impedances for both networks are essentially the same. The tail currents for the two RS-FFs of the regenerator and the peak detector are essentially equal and it ensures precise cancellation of non-linear effects.

19 Claims, 10 Drawing Sheets

DATA PULSE RECEIVER

TECHNICAL FIELD

The present invention relates to a data pulse receiver.

BACKGROUND INFORMATION

In a digital transmission system, a data signal, which is a serial binary signal having binary 1s and 0s represented respectively by the presence and absence of positive voltage, is transmitted. Since, in the transmission of the data signal, the pulse level thereof is lowered, it is necessary to detect and amplify the low level data pulses or regenerate data. A data pulse receiver is used for data regeneration and/or clock recovery from an incoming digital signal. It provides a data regenerating circuit for producing, from an incoming digital data signal, a data signal and also, to provide a clock recovery circuit, from the incoming digital signal, a clock signal which is used for timing purposes in processing the data signal.

With the advent of the dawn of the Information Highway and the explosion of telecommunications, the quantity and speed of data transmission continues to grow. In the telecommunications industry as well as in the computer industry, there exists a need to transmit large quantities of data from point to point, for example between memory and processors in multiple processor computers. The large number of data bits coupled with the large number of connections create an interconnect bottle-neck which requires large numbers of data drivers with their associated large amount of electrical power. One way that is employed to overcome this congestion difficulty is to multiplex large numbers of parallel bit streams up to higher rate serial bit streams, thus reducing the numbers of electrical connections that need to be made. The need for low power multiplex and demultiplex circuits capable of combining data signals at, say, 50 Mb/s up to, for example, 1 Gb/s has attracted a number of commercial integrated circuit vendors. Nevertheless, the computer and communications industry continues to search for lower power solutions.

A technique that has been employed with success to reduce the number of interconnections in a communications switching equipment is to employ a method known as a contactless back plane. Such a method permits point-to-multipoint and multipoint-to-point data transmission over a passive backplane without loss of signal integrity due to the multipoint connections. In this method, distribution of the multi gigabit-per-second serial data employs a form of ac coupling, of such small proportions, that the data information is contained in the data transitions. In such a methodology, the received data at the demultiplex circuit is considerably attenuated, signal levels of only 70 mV peak to peak, or less, are not uncommnon. Reliable reception of the data requires special techniques, including signal amplification, wide frequency bandwidth, matched input impedance and some form of hysteresis to discriminate against unwanted noise signals. The resultant signal is to be restored to a non-return-to-zero (NRZ) format from a return-to-zero (RZ) format.

U.S. Pat. No. 5,852,637, issued Dec. 22, 1998 and entitled "A Serial Multi-Gb/s Data Receiver" by A. K. D. Brown, et al. discloses a data pulse receiver which regenerates data in NRZ format from a return-to zero (RZ) format data signal. The data pulse receiver includes a data regenerator having a hysteresis circuit for regenerating data from an incoming data signal and a peak detector for monitoring the pulse level of the data signal and automatically controlling current flowing in the hysteresis circuit. Also, U.S. application Ser. No. 09/054,440 entitled "Multi-Gb/s Data Pulse Receiver" filed by A. K. D. Brown on Apr. 3, 1998 and U.S. application Ser. No. 09/071,117 entitled "Method And Apparatus For Performing DATA Pulse Detection" filed by A. K. D. Brown on May 4, 1998 disclose data pulse receivers which regenerate data in NRZ format from RZ format data signals, the data pulse receivers including Williamson couplers for transmitting data signals to data regenerators and peak detectors. In each of these data pulse receivers, the data regenerator and the peak detector includes similar circuits having a set-reset flip-flop (RS-FF) as a hysteresis circuit and a tail current circuit. The tail current is automatically adjusted in response to the peak level detected by the peak detector. A drawback of these data pulse detectors is not to provide a precise hysteresis control of the RS-FFs.

SUMMARY OF THE INVENTION

It is an object of the present invention to provide an improved data pulse receiver which meets the requirement to detect serial data at gigabit-per-second rates received over a transmission medium through which the signal levels have been substantially attenuated.

According to one aspect of the present invention, there is provided a data pulse receiver responsive to a clocked data signal having a continuous sequence of transitions, the data pulse receiver comprising: data regeneration means for providing a hysteresis to regenerate data in response to a first input signal derived from the clocked data signal; level detection means for detecting a signal level of a second input signal derived from the clocked data signal; and control means for adjusting the hysteresis of the data regeneration means in response to the signal level detected by the level detection means.

For example, the data regeneration means comprises: a first differential amplifier including first and second transistors, the bases of which are ac grounded; and first hysteresis means including third and fourth transistors, the bases of which are connected to the collectors of the first and second transistors, operating current of the first hysteresis means being provided by a first current circuit, the first hysteresis means operating in response to first differential input signals fed to the emitters of the first and second transistors, the first differential input signals being derived from the differential input signal. The level detection means comprises: a second differential amplifier including fifth and sixth transistors, the bases of which are ac grounded; and second hysteresis means including seventh and eighth transistors, the bases of which are connected to the collectors of the fifth and sixth transistors, operating current of the second hysteresis means being provided by a second current circuit, the second hysteresis means operating in response to second differential input signals fed to the emitters of the fifth and sixth transistors, the second differential input signals being derived from the differential input signal, the output of the second hysteresis means varying the currents of the first and second current circuits. The control means comprises adjust means for adjusting the currents of the first and second current circuits by comparing the output of the second hysteresis means to a reference voltage, so that the currents of the first and second current circuits are essentially equal.

The level detection means operates as a peak detector for detecting the peak of the differential input signal derived from the data signal. The differential input signals are provided to the data regeneration means and the level detection means via first and second input impedance networks, respectively, which are connected to differential input terminals. The input impedances of the input terminals are essentially equal (e.g., 50 Ω). The impedance of impedance elements of the second input impedance network is double of that of the first input impedance network and thus, signal attenuation of the latter is twice as large as that of the former. By using the same bias current, non-linear effects in the data regeneration means and the level detection means are cancelled. The first and second hysteresis means convert an RZ pulse waveform into an NRZ data waveform.

BRIEF DESCRIPTION OF THE DRAWINGS

Embodiments of the present invention will now be described by way of example with reference to the accompanying drawings in which.

DETAILED DESCRIPTION

I. Related Art

Figure 1:
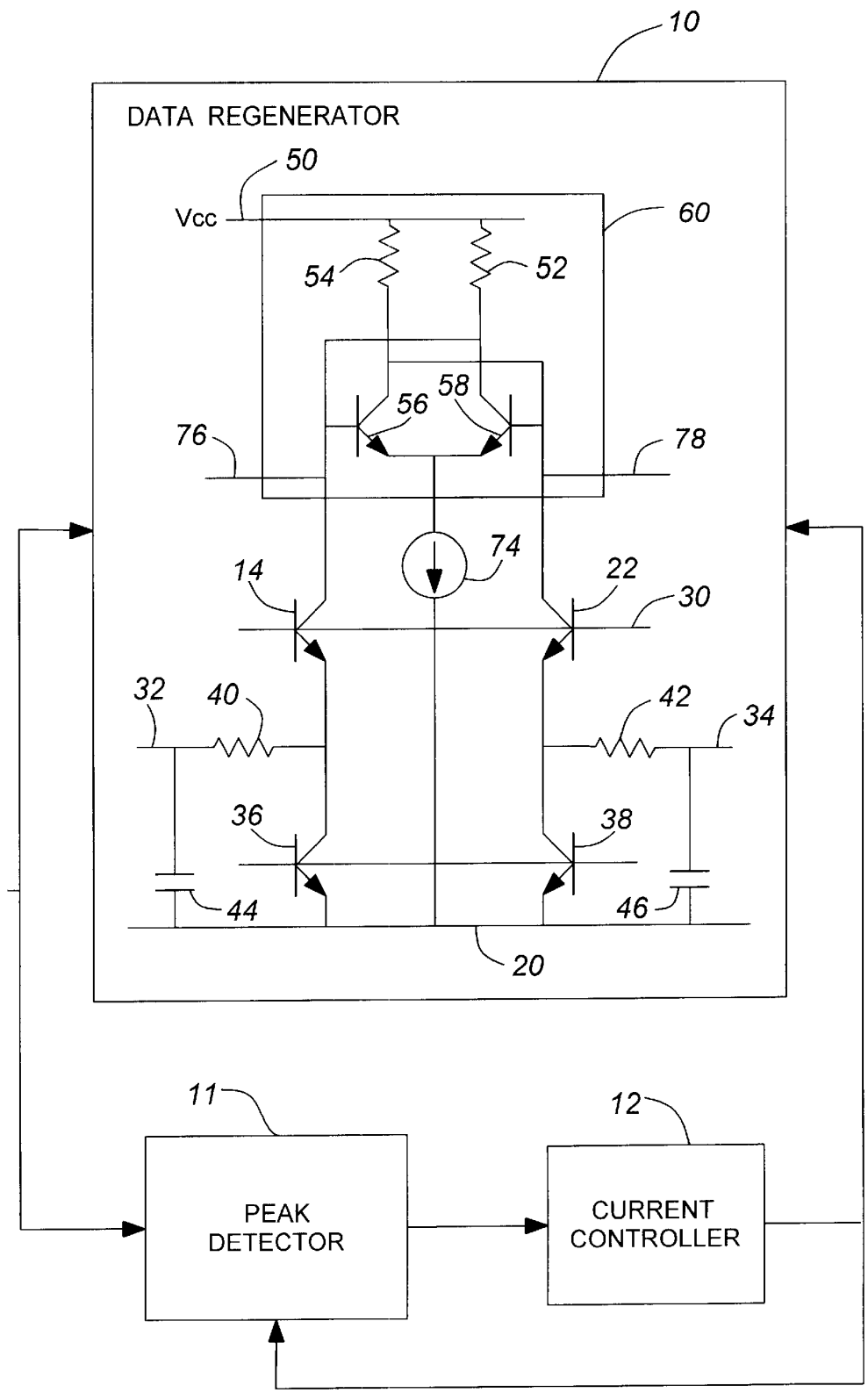
FIG. 1 illustrates a data pulse receiver related to the present invention.

FIG. 1 shows a data pulse receiver including a data regenerator and a peak detector which is related to the present invention. In FIG. 1, a typical data signal having continuous sequence of transitions is fed to a data regenerator 10 and a peak detector 11. The data regenerator 10 regenerates data in response to the data signal. The peak detector 11 monitors the pulse level of the data signal and provides a level signal to a current controller 12 to automatically adjust current flowing in hysteresis flip-flops of the data regenerator 10 and the peak detector 11. The data regenerator 10 and the peak detector 11 include pulse amplifiers-having the same circuit. Each of the pulse amplifiers includes transistors 14, 22, each operating as a grounded base amplifier. The bases of the transistors 14, 22 are connected to a terminal 30 which is typically biased at 1.3 volts dc and ac grounded. The emitters of the transistors 14, 22 are connected to negative and positive input terminals 32, 34 via impedance matching resistors 40, 42, respectively. Capacitors 44, 46 represent stray capacitance inherent in the structure. The data signal having continuous sequence of transitions is differential and its differential data pulses are fed to the input terminals 32, 34.

The emitters of the transistors 14, 22 are connected to the collectors of transistors 36, 38, respectively, the emitters of which are connected to ground 20. The bases of the transistors 36, 38 are dc biased, so that they operate as current sink circuits for the grounded base amplifiers. The collectors of the transistors 14, 22 are connected to a voltage terminal 50 of positive supply voltage (e.g., +5 V) via load resistors 52 and 54, respectively. The resistors 52,54 in combination with emitter coupled transistors 56, 58 form a set-reset flip-flop (RS-FF) 60 which has a hysteresis and operates as a data regenerating circuit. The RS-FF 60 converts an RZ pulse signal to an NRZ format output signal. The coupled emitters of the transistors 56, 58 are connected to a current sink circuit 74 which provides a tail current to the RS-FF 60. The output signal in NRZ format is provided at complementary output terminals 76, 78.

Figure 2:
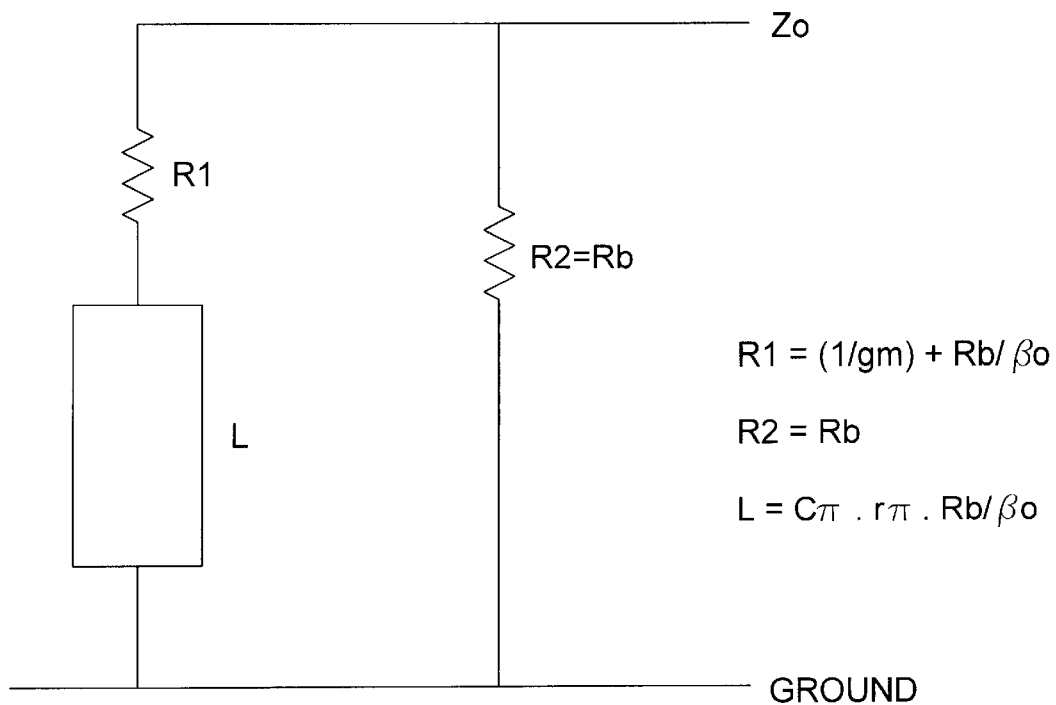
FIG. 2 illustrates an equivalent circuit for emitter input impedance.
Figure 3:
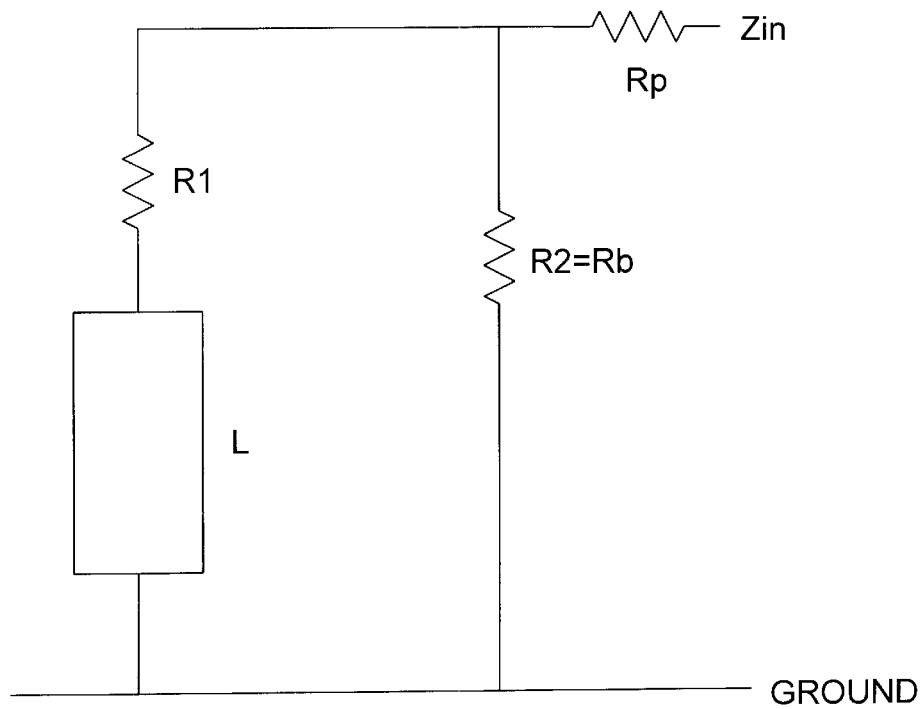
FIG. 3 illustrates a grounded base amplifier input impedance.

The pulse amplifier has the largest possible bandwidth due to the use of the grounded base amplifiers of the transistors 14, 22. The effect of parasitic capacitors 44, 46 on the input terminals 32, 34, which would normally shunt the input signal, is compensated by an inductance seen at the emitters of the transistors 14, 22. This effect significantly extends the frequency response of the grounded base amplifiers. The design of the grounded base amplifier is known. The input impedance of a grounded base amplifier (equivalent to that of an emitter follower), has an equivalent circuit as shown in FIG. 2. Taking into consideration the impedance matching resistors 40, 42 and transistors 36, 38, the grounded base input impedance equivalent circuit is shown in FIG. 3. Bearing in mind that this input impedance will vary depending upon the amplitude of the input signal and the desirability of attaining an input impedance of approximately 50 Ω over the full range of the input pulse amplitude, this dictates the nominal emitter current required in the grounded base amplifier.

The transistors 14, 22 of the grounded base amplifiers are connected to the RS-FF 60. The magnitude of the tail current of the RS-FF 60 can be adjusted by the current sink circuit 74 to obtain a controlled amount of hysteresis. In practice, the tail current is adjusted to an amount specified for detection of a particular input signal current. This input current passes through the load resistors 52, 54 of the RS-FF 60. At the same time, the tail current of the RS-FF 60 passes through the same load resistors 52, 54. Therefore, to change the state of the RS-FF 60, the voltage produced by the input current in the resistors 52, 54 must exceed the voltage established by the tail current in the same resistors 52, 54.

The tail current in the RS-FF 60 can be easily adjusted by means of an external resistor or wired connection, to suit a particular application. If the input signal is differential then the contribution of the input signal currents from both input terminals 32, 34 must be taken into account. However, if the input signal is only applied to one input of the pulse amplifier, the tail current must be halved for the same amount of hysteresis. In most circumstances, the input signal is differential to take advantage of the substantial immunity to common mode input noise of the pulse amplifier. It should also be noted that according to standard communications theory, the input noise level relative to the hysteresis level must be of the order of −24 dB to obtain a transmission bit error rate of one error in $10_{-14}$.

In a particular application of the serial data receiver, it can be deployed in circumstances, where the input signal level is either not known, or is variable. Under these conditions a fixed hysteresis level is undesirable since an optimum bit error rate cannot generally be obtained. To overcome this difficulty it is desirable to monitor the level of the incoming data signal and to adjust the hysteresis level by automatic means.

A target specification for the pulse amplifier is that it should be able to detect incoming data pulses having a peak amplitude of 30 mV and pulse duration exceeding the hysteresis level of not less than 200 ps. The energy present in such data pulses is so small that monitoring the level accurately presents some difficulty. In this regard, recall that the data pulses are converted immediately from RZ format to NRZ format by the pulse amplifier. Direct monitoring of the amplitude of the input data stream has in fact not been possible. However, an alternative scheme has been employed which successfully monitors the input pulse height very accurately and enables optimum adjustment of the hysteresis level.

The pulse height at the output terminals 76, 78 of the pulse amplifier is primarily determined by the level of the hysteresis bias current of the RS-FF 60. The RS-FF 60 will toggle, thereby changing the state of the output terminals 76, 78, provided that the input data signal magnitude exceeds the hysteresis level by an unknown amount. If the output terminals 76, 78 are connected to a differential pair, then the output of the differential pair will also toggle, if the RS-FF 60 toggles. Further, common mode variations at the output terminals 76, 78 will not be present at the output of the differential pair. Thus the presence or absence of pulses at the output of the differential pair can be taken to indicate that the hysteresis level is either less than or greater than the differential magnitude of the incoming data pulse.

By ac coupling the output of the differential pair to a rectifier circuit, one obtains a signal whose magnitude is either large, or very small, depending on whether the hysteresis level is less than or greater than the incoming data pulse peak magnitude. In addition, by integrating the output of the rectifier circuit, a voltage is obtained which can be used to adjust the level of the hysteresis bias current. The net result is an automatic hysteresis level adjustment (AHLA) which continually adjusts the pulse amplifier hysteresis level to the level of the data pulses.

However, it will be immediately clear that the adjustment of the hysteresis level to the peak magnitude of the data pulses will result in unreliable reception of the data. It will be unreliable because even a slight reduction in the magnitude of a data pulse could result in it not being detected. Utilizing a second pulse amplifier in parallel with the first pulse amplifier provides a solution to this problem. The first pulse amplifier monitors the data pulse magnitude while the second pulse amplifier has its hysteresis level set to a value proportionally lower than that of the first pulse amplifier. In fact, it is possible to set the hysteresis level of the second pulse amplifier to be any desired proportion of the peak height of the data pulse. A level of 50% usually results in optimum bit error rate performance. Of course, when two data pulse amplifiers are connected in parallel, their individual input impedance are adjusted to provide a proper combined input termination impedance.

Figure 4:
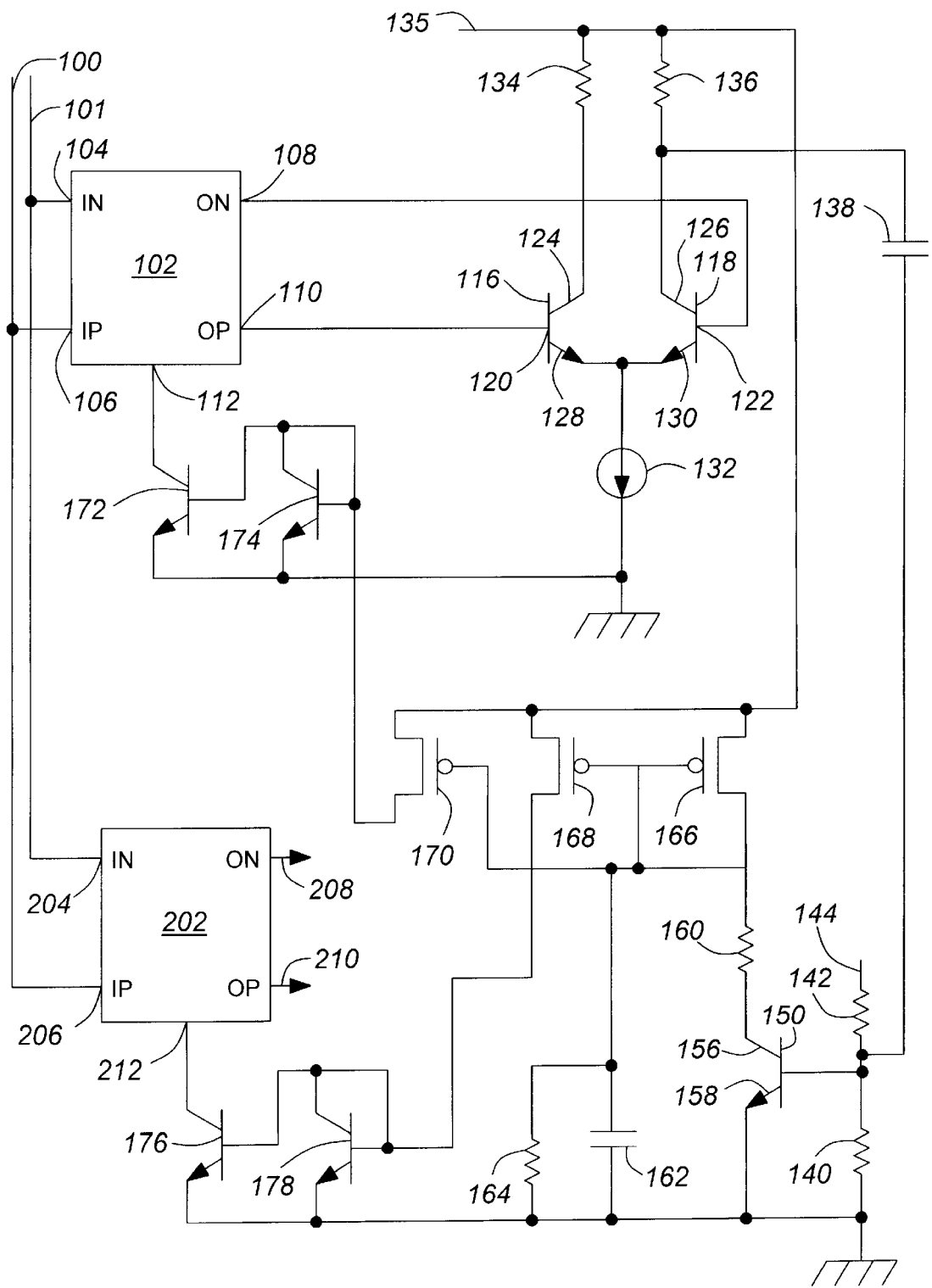
FIG. 4 is a detailed circuit diagram of a current controller shown in FIG. 1.
Figure 5:
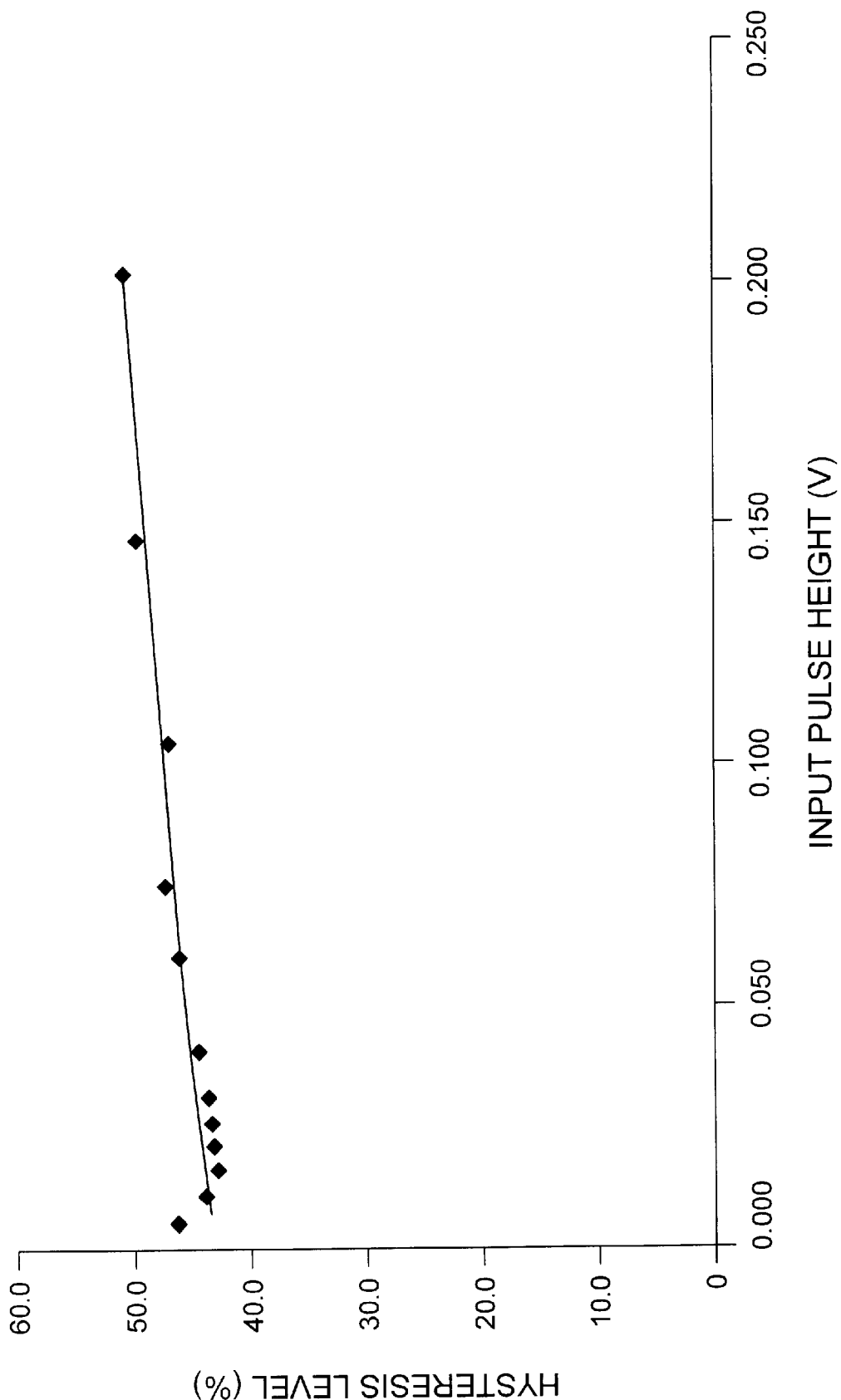
FIG. 5 is a graph of input pulse (v) vs. hysteresis level.

FIG. 4 shows the current controller 12 in a detail, the controller generating automatic hysteresis adjustment. In FIG. 4, input data pulses are transferred to the pulse receiver via lines 100, 101. Pulse amplifiers 102, 202 correspond to the peak detector 11, the data regenerator 10 of FIG. 1, respectively. The differential pulse input is supplied at input terminals 104 and 106 of the pulse amplifier 102. The amplifier output is taken from terminals 108, 110 while the current sink for this amplifier is supplied at terminal 112. The pulse amplifier 102 is used to monitor the data level. The other pulse amplifier 202 having input terminals 204, 206, output terminals 208, 210 and automatically adjusted hysteresis tail current supplied at terminal 212, is used to receive the data with very low bit-error-rate.

The differential output of the pulse amplifier 102 is supplied to a differential pair of transistors 116, 118 at their respective bases 120, 122. The transistors 116, 118 have respective emitters 128, 130 connected to a current sink circuit 132 for providing bias current thereto. The transistors 116, 118 have respective collectors 124, 126 connected to a positive supply 135 via two respective load resistors 134, 136. The transistors 116, 118 will switch if the output of the pulse amplifier 102 switches. This will occur if the data pulse peak magnitude is greater than the hysteresis level of the pulse amplifier 102. An output of the differential pair of the transistors 116, 118 is taken from the load resistor 136 and is ac coupled via a capacitor 138 to a detector circuit comprising two resistors 140, 142 and a transistor 150. In a practical circuit one might also utilize the output from the load resistor 134 with an additional parallel connected detector circuit, thereby increasing the sensitivity of the circuit. The second detector circuit is not shown in FIG. 4 for the sake of simplicity.

It is to be assumed that the transistors 116, 118, 172, 174, 176 and 178 are all the same size. P-channel field effect transistors (FETs) 166, 168 and 170 have different sizes. In particular the ratio of the transconductance of the FETs 170, 168 determines the ratio of the current sink from the pulse amplifiers 102, 202, respectively. The pairs of the transistors 172, 174 and 176, 178 are 1:1 mirrors used for mirroring the current sourced by the FETs 170, 168, respectively. If the transconductance of the FET 166 is less than that of the FET 168 then the P-channel FET mirror of the FETs 166, 168 will exhibit current gain. This current gain increases the accuracy of pulse height detection which is an advantage. In a particular application, the FETs 166, 168 and 170 have equal channel lengths and their channel widths are in the ratio 1:5:10, respectively. In this arrangement the hysteresis level of the pulse amplifier 202 will be set to half of the data peak amplitude.

The detection circuit comprising the resistors 140, 142 and the transistor 150 is biased by means of a reference voltage 144. The ratio of the resistors 140, 142 is selected so that the voltage at the base 152 is just less than a diode voltage drop, say about 0.75 volts. When pulses are coupled via the capacitor 138 to the base 152, they momentarily increase the potential on the base 152 and thereby cause the transistor 150 to conduct current which results in a reduction in the gate potential of the FET 166. The capacitor 162 in conjunction with the resistor 160 is used to integrate the pulsed current from the transistor 150, so that the FETs 166, 168 and 170 conduct a slowly varying current. The minimum value of the current in the FETs 166, 168 and 170 is set by the resistor 164, thereby establishing a minimum level of hysteresis. This is useful in the case of the absence of input data because it helps to prevent "chattering" of the output due to noise pulses. In a particular example of this circuit in which the data rate is 1.25 Gb/s, the time constant of the resistor 160 and the capacitor 162 is set to about 20 ns.

Referring to FIG. 1, the function of the two transistors 56, 58 of the RS-FF 60 of the basic pulse amplifier operate as a regenerating comparator for the purpose of detecting the input data pulses. The switching point of the comparator is determined by the magnitude of the flip-flop tail current in comparison to the magnitude of the impulse current obtained from the input data pulses. This feature is used in the related art to obtain an automatically adjusted hysteresis level. Specifically, in U.S. Pat. No. 5,852,637, two data pulse amplifiers 102, 202 are used with ratioed flip-flop tail currents. One of the flip-flops functions as a pulse magnitude peak detector, while the other operates as a data pulse regenerator and typically the ratio of the tail currents is set to 2:1 so that the data pulse regenerator hysteresis level is conveniently set to half of the input data pulse height so as to maximize the bit error rate. This method is exploited further in U.S. application Ser. No. 09/071,117 where multiple data pulse amplifiers derive their hysteresis level settings from a single peak pulse height detector that monitors a continuous input clock pulse height.

Also, U.S. application Ser. Nos. 09/054,440 and 09/071,117 disclose related art data pulse receivers which include Williamson couplers. The Williamson coupler operates with a high speed transmission medium including data and clock channels. In the data pulse receiver, a typical data signal having continuous sequence of transitions is fed to a differential data driver which transmits differential signals on transmission lines connected to a Williamson coupler. The coupler detects the differential signals and provides differential data pulses on an open coupler output and a dc grounded coupler output which are connected to a pulse amplifier. Each signal that is to be detected on the high speed data transmission medium requires a separate Williamson coupler.

While the data pulse receivers mentioned in U.S. Pat. No. 5,852,637 and application Ser. Nos. 09/054,440 and 09/071,117 perform an adequate data pulse recovery function under most circumstances, it has been determined that due to the nature of the finite gain of the flip-flop there is some degree of approximation in the accuracy of the hysteresis setting for the data regenerator.

The following mathematical analysis determines the degree of approximation due to the finite gain of the flip-flop. It will be appreciated that the gain of the differential pair of transistors which form the flip-flop is determined by a transcendental equation for which there is no general closed-form mathematical solution. However, the inventor has been able to obtain a closed-form mathematical solution at the actual switching point of the comparator comprised of the flip-flop.

II. Mathematical Analysis of the Pulse Receiver AHLA System

The pulse receiver AHLA system is designed to measure the pulse height of the incoming pulses and to adjust the hysteresis level for approximately 50% of the pulse height. In practice this target is not quite achieved due to several factors including:

- the variation of pulse height measurement due to the bang-bang nature of the control circuit. This error can be suppressed by employing a sufficiently large integrating capacitor as disclosed in the related art;
- the nature of the detection circuitry is that the regenerative flip-flop does not respond as an ideal comparator, particularly at low signal levels.

The following presents a mathematical analysis of the non-linear response of the detection circuitry. This analysis is difficult because the equations involved are transcendental and therefore defy a general closed-form solution. The possibility of a closed-form solution does exist however, for particular points on the operation plane. The particular solution that is sought here is to identify the value of the circuit currents at the point of switching, utilizing the additional constraint that this is an unstable operating point. First the transcendental equations must be written as follows:

$$-(v/R) = i_1 + i_2 - i_3 \tag{1}$$

from Kirchoff's current law, all quantities are "positive" going into the summing node. Here v represents the differential voltage established at the input of the flip-flop in resistive load R, $i_1$ represents the input pulse current and $i_2$ and $i_3$ are the regenerating flip-flop collector currents.

$$v = (kT/q) \times \ln(i_3/i_2) \tag{2}$$

input voltage defines current ratio.

The primary requirement for the solution of the required unstable operating point is to identify the independent variables. For example, the input current $i_1$ is an independent variable, prescribed by the incoming pulse height. At the unstable switching point the gain of the circuit is zero as it switches from negative feedback to positive feedback in relation to the input current $i_1$. Snap action follows the commencement of positive feedback. Thus the rate of change of the input current $i_1$ must be exactly balanced by the rate of change of the feedback current ($i_3-i_2$), where $i_2$ and $i_3$ are the flip-flop collector currents. The requirement therefore is to find the values of $i_2$ and $i_3$ for a particular value of $i_1$ such that $\delta (i_3-i_2)-\delta (i_1)$ is zero, that is, a snap action takes place. This should lead to a solution for the flip-flop tail current ($i_2+i_3$) which establishes the hysteresis level. For the process of differentiation it is legitimate to consider $(i_2+i_3)=i_4$ constant. Therefore:

$$\delta i_2 = -\delta i_3 \tag{3}$$

$$\delta i_1 = -\delta(i_3-i_2) = 2\delta i_3 \tag{4}$$

$$i_1 = (i_3 - i_2) - \frac{kT}{qR} \times \ln\left(\frac{i_3}{i_2}\right) \tag{5}$$

$$1 = \frac{\delta i_3}{\delta i_1} + -\frac{\delta i_2}{\delta i_1} - C\left(\frac{i_2}{i_3}\right)\left(\frac{\delta i_3}{i_2 \delta i_1} - \frac{i_3 \delta i_2}{i_2^2 \delta i_1}\right), \ldots \text{where} \ldots C = \frac{kT}{qR} \tag{6}$$

Substituting Equation (3)

$$1 = 2 \times \frac{\delta i_3}{\delta i_1} + C\left(\frac{i_2}{i_3}\right)\frac{\delta i_3}{\delta i_1}\left(\frac{1}{i_2} - \frac{i_3}{i_2^2}\right) = \frac{\delta i_3}{\delta i_1}\left(2 - C\left(\frac{1}{i_3} - \frac{1}{i_2}\right)\right) \tag{7}$$

Simplifying:

$$1 = \frac{kT}{Rq}\left(\frac{1}{i_3} - \frac{1}{i_1}\right) \tag{8}$$

$$i_3 = \left[i_2^{-1} + \frac{Rq}{kT}\right]^{-1} \tag{9}$$

Thus, for a particular value of $i_2$, $i_3$ can be calculated from Equation 9, and thence the tail current ($i_2+i_3$). Also from Equation 1, the input current $i_1$ can now be calculated, and thence the input voltage. And so a graph can be constructed of input voltage against hysteresis tail current. This can be repeated for various temperatures.

Figure 6:
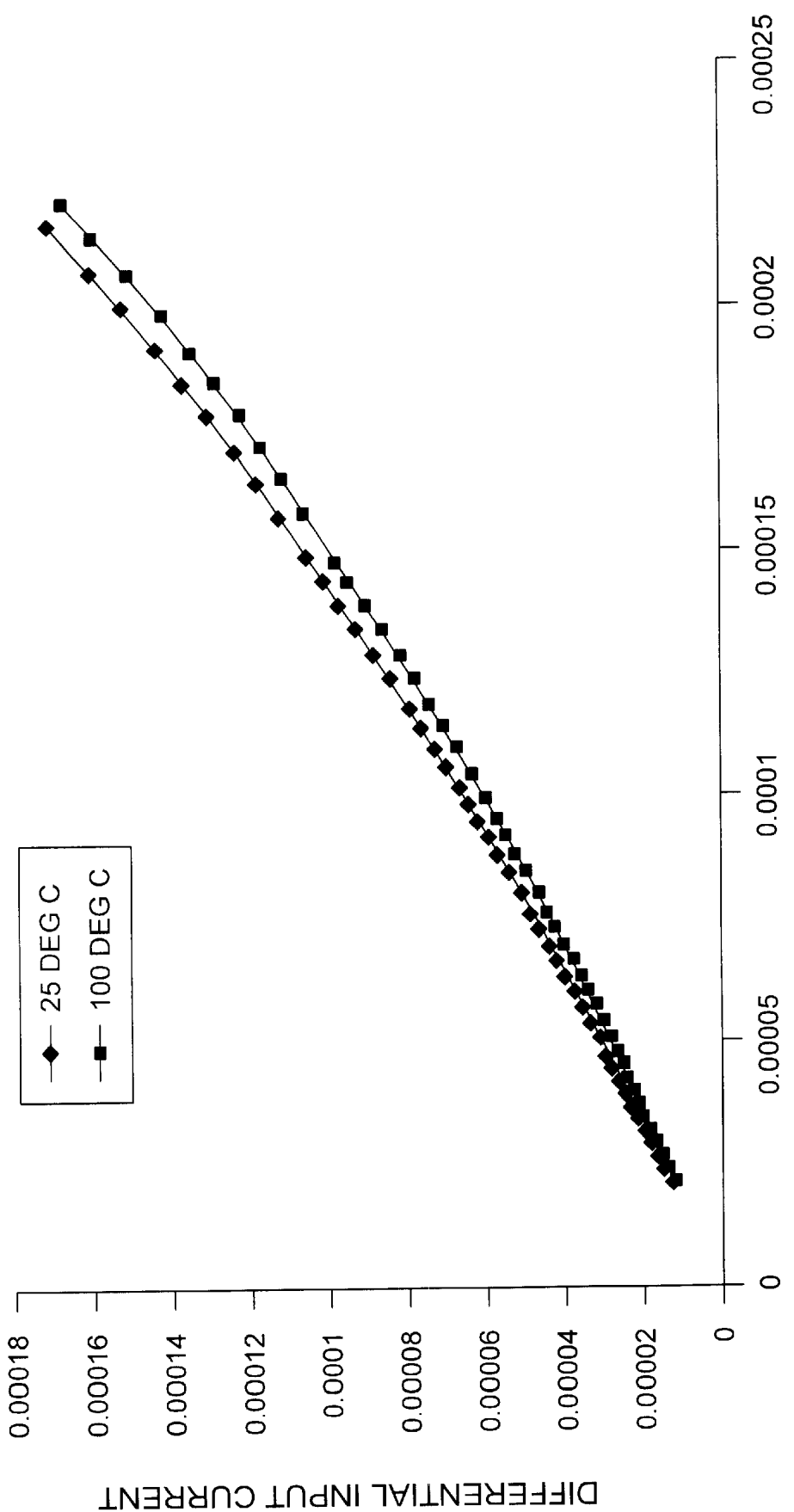
FIG. 6 is a graph of tail current vs. differential input current.
Figure 7:
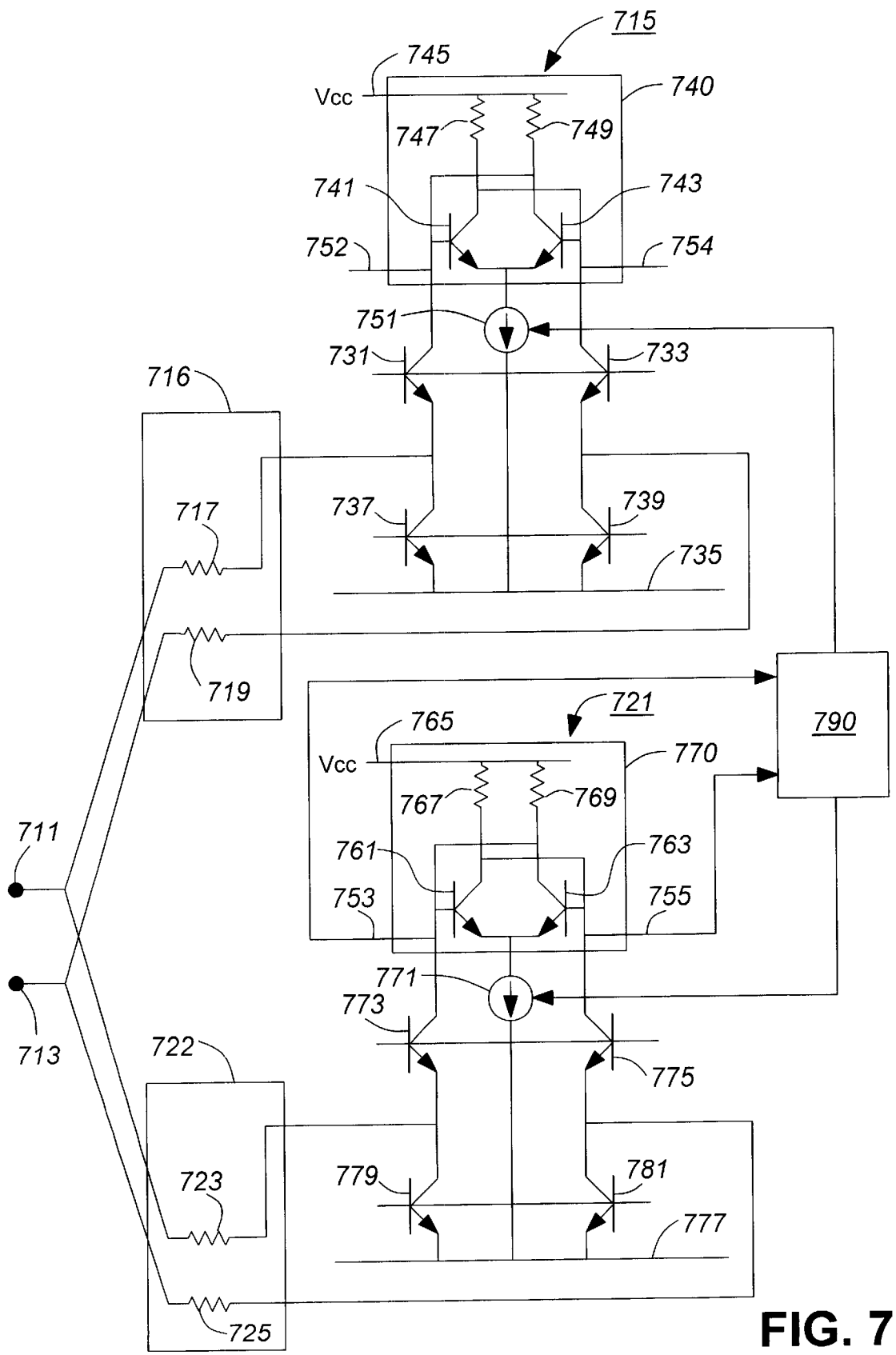
FIG. 7 is a circuit diagram of a data pulse receiver according to an embodiment of the present invention.

The foregoing mathematical solution for the transcendental equations at the switching point of the data pulse receiver has been applied to a particular related art data pulse receiver. The results are shown for 27 deg C. and 100 deg C. on a graph of FIG. 6. The hysteresis level is nominal 50% for 150 ohm load resistor and 25 deg C. The calculated hysteresis value for a nominal 50% hysteresis setting is plotted against single ended input pulse amplitude. It is clear that the actual hysteresis value at a 50 mV pulse amplitude is about 45%. Note that for large pulse levels the hysteresis level approaches the ideal 50% asymptotically. Additionally, a graph of FIG. 7 illustrates the non-linear relationship between the input pulse current level and the comparator flip-flop tail current.

The limitations of the accuracy of the control of the hysteresis level of the related art as described in the foregoing section are primarily dependent upon the fact that the peak detector flip-flop and the data regenerator flip-flop are operated at different tail current levels, typically in the ratio of 2:1. Since, according to the preceding analysis the relationship between the input current level and the flip-flop tail current at the switching point is non-linear, it follows that the peak detector flip-flop and data regenerator flip-flop do not precisely track each other at low data pulse levels. This is illustrated in the graph of FIG. 6. The present invention seeks to incorporate all of the benefits of the related art as given in U.S. Pat. No. 5,852,637 and application Ser. Nos. 09/054,440 and 09/071,117 while eliminating entirely the effect of non-linearity on the prescribed hysteresis level.

It will be appreciated that if the data regenerating flip-flop and the peak-detector flip-flop are biased with precisely the same tail currents, then their operation at the switching point will be identical. Such an arrangement permits the peak detector flip-flop to provide a precision metering function for the data regenerating flip-flop, notwithstanding their non-linearities, since the former precisely mimics the latter. However, since the peak detector flip-flop responds to the peak amplitude of the incoming pulse, such an arrangement would cause the data regenerator flip-flop to switch, unreliably, on the peaks of the input pulses, rather than at 50% of the amplitude of the incoming pulse. Accordingly the input circuits of the peak detector and the data regenerator are modified by adaptation of the input termination resistors in such a manner that the data regenerator receives current pulses of twice the amplitude of those received by the peak detector. At the same time, the input impedance prescribed by these resistors according to the related art, are to be maintained. Four possible arrangements for the input resistors are described hereinafter.

III. Structure and Operation of Embodiments

III-1. First Embodiment

FIG. 7 shows a data pulse receiver according to an embodiment of the present invention. In FIG. 7, differential data input terminals 711, 713 are connected to a data regenerator 715 via an input impedance network 716 including resistors 717, 719. Also, the data input terminals 711, 713 are connected to a peak detector 721 via an input impedance network 722 including resistors 723, 725.

The data regenerator 715 includes a pulse amplifier having two transistors 731, 733, each forming a grounded base amplifier. The bases of the transistors 731, 733 are connected to an ac grounded and are typically biased at 1.3 volts dc by a dc voltage supplier (not shown). The emitter of the transistor 731 is connected to the differential data input terminal 711 via the resistor 717 of the input impedance network. Also, the emitter of the transistor 731 is connected to the collector of a transistor 737, the emitter of which is connected to an internal on-chip ground 735. Similarly, the emitter of the transistor 733 is connected to the differential data input terminal 713 via the resistor 719 of the input impedance network 716. Also, the emitter of the transistor 733 is connected to the collector of a transistor 739, the emitter of which is connected to the ground 735. The bases of the transistors 737, 739 are biased by dc voltage means (not shown), so that they operate as current sink circuits. The data regenerator 715 includes an RS-FF 740 having a pair of transistors 741, 743, the collectors of which are connected to a voltage terminal 745 of dc supply voltage Vcc (e.g., +5 volts) via load resistors 747, 749, respectively. The RS-FF 740 formed by the load resistors 747, 749 in combination with the transistors 741, 743 reconverts an RZ pulse signal to an NRZ format output signal. The emitters of the transistors 741, 743 are coupled and the coupled emitters are provided with a tail current by a current sink circuit 751 which has a return path to the ground 735.

The peak detector 721 also includes a pulse amplifier having emitter coupled transistors 761, 763, the collectors of which are connected to a voltage terminal 765 of the dc supply voltage Vcc via load resistors 767, 769, respectively. The transistors 761, 763 and the resistors 767, 769 form an RS-FF 770. The coupled emitters of the transistors 761, 763 are connected to a current sink circuit 771. The pulse amplifier includes two transistors 773, 775, each forming a grounded base amplifier. The bases of the transistors 773, 775 are ac grounded and are typically biased at 1.3 volts dc by a dc voltage supplier (not shown). The emitter of the transistor 773 is connected to the differential data input terminal 711 via the resistor 723 of the input impedance network 722. The emitter of the transistor 773 is connected to the collector of a transistor 779, the emitter of which is connected to ground 777. Similarly, the emitter of the transistor 775 is connected to the differential data input terminal 713 via the resistor 725 of the input impedance network 722. The emitter of the transistor 775 is connected to the collector of a transistor 781, the emitter of which is connected to the ground 777. The bases of the transistors 779, 781 are biased by dc voltage means (not shown). The collectors of the transistors 773, 775 (i.e., the outputs of the RS-FF 721) are connected to a current controller 790 which controls the tail currents of the current sink circuits 751, 771.

The resistances of the resistors 717, 719, 723 and 725 are selected to 75 Ω, 75 Ω, 150 Ω and 150 Ω, respectively. The input impedances at the differential data input terminals 711, 713 are 50 Ω. The input terminals 711, 713 are connected to a conventional data signal output circuit (not shown) to receive differential data pulses which are derived from a clocked data signal having continuous sequence of transitions.

Figure 8:
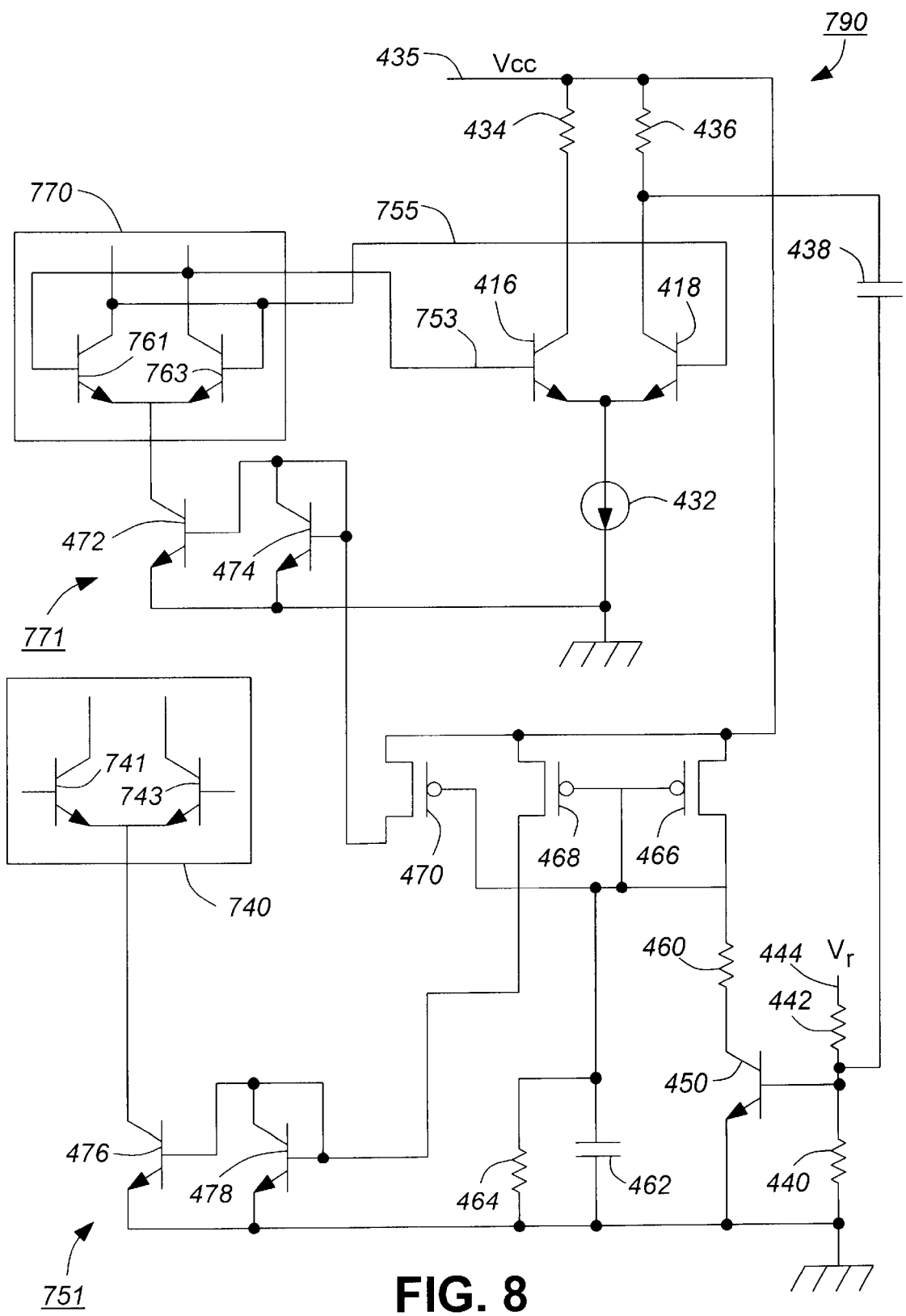
FIG. 8 is a detailed circuit diagram of a current controller shown in FIG. 7.

FIG. 8 shows a detail circuit of the current controller 790 of FIG. 7. Referring to FIGS. 8 and 7, output terminals 753, 755 of the RS-FF 770 of the peak detector 721 are connected to the bases of emitter coupled transistors 416, 418, the collectors of which are connected to a voltage terminal 435 of supply voltage Vcc (e.g., +5 volts) via two respective load resistors 434, 436. A current sink circuit 432 is connected between the coupled emitters of the transistors 416, 418 and the ground terminal. The coupled emitters of the transistors 741, 743 of the RS-FF 740 of the data regenerator 715 are connected to the collector of a transistor 476, the emitter and base of which are directly grounded and grounded via a diode-connected transistor 478, respectively. The transistor 476 forms part of the current sink circuit 751. Similarly, the coupled emitters of the transistors 761, 763 of the RS-FF 770 of the peak detector 721 are connected to the collector of a transistor 472, the emitter and base of which are directly grounded and grounded via a diode-connected transistor 474, respectively. The transistor 472 forms part of the current sink circuit 771. The collector of the transistor 418 is connected via a capacitor 438 to a junction of two resistors 442, 440 which are connected in series between a voltage terminal 444 of a reference voltage Vr and the ground terminal. The junction is also connected to the base of a transistor 450, the emitter of which is grounded. The collector of the transistor 450 is connected to the gates of three P-channel FETs 466, 468 and 470 via a resistor 460. The sources of the FETs 466, 468 and 470 are connected to the Vcc terminal 435. The gates of the FETs 466, 468, 470 and the drain of the FET 466 are connected to the ground terminal via parallel-connected capacitor 462 and resistor 464. The drain of the FET 470 is connected to the bases of the transistors 472, 474. The drain of the FET 468 is connected to the bases of the transistors 476, 478.

The transistors 416, 418, 472, 474, 476 and 478 are the same size. The FETs 466, 468 and 470 have the same sizes. In particular, the ratio of the transconductance of the FETs 468 and 470 determines the ratio of the current sink from the data regenerator 715 and the peak detector 721, respectively. The FETs 466 and 468 form one current mirror and the FETs 466 and 470 form another current mirror. The pair of the transistors 472, 474 connected to the FET 470 and the pair of the transistors 476, 478 connected to the FET 468 are 1:1 mirrors used for mirroring the current sourced by the FETs 470 and 468, respectively. If the transconductance of the FET 466 is less than that of the FET 468 then the P-channel FET mirror of the FETs 466,468 will exhibit current gain. This current gain increases the accuracy of pulse height detection which is an advantage. In a particular embodiment of the invention the FETs 466, 468 and 470 have equal channel lengths and their channel widths are in the ratio 5:5:10, respectively. In this arrangement, the hysteresis level of the peak detector 721 will be set to half of the data peak amplitude.

The differential output of the peak detector 721 is supplied to a differential pair of the transistors 416, 418 at their respective bases. The transistors 416, 418 will switch if the output of the peak detector 721 switches. This will occur if the data pulse peak magnitude is greater than the hysteresis level of the peak detector 721. The output of the differential pair of transistors 416, 418 is taken from the load resistor 436 and is ac coupled via the capacitor 438 to a detector circuit comprising the two resistors 440, 442 and the transistor 450. In a practical circuit one might also utilize the output from the load resistor 434 with an additional parallel connected detector circuit, thereby increasing the sensitivity of the circuit. The second detector circuit is not shown in FIG. 8 for the sake of simplicity.

The detection circuit includes the resistors 440, 442 and the transistor 450. The resistance ratio of the resistors 440, 442 is selected so that the voltage at the base of the transistor 450 is just less than a diode voltage drop, say about 0.75 volts. When pulses are coupled via the capacitor 438 to the base of the transistor 450, they momentarily increase the potential on its base and thereby cause the transistor 450 to conduct current which causes a reduction in the gate potential of the FET 466. The capacitor 462 in conjunction with the resistor 460 is used to integrate the pulsed current from the transistor 450, so that the FETs 466, 468 and 470 conduct a slowly varying current. The minimum value of the current in the FETs 466, 468 and 470 is set by the resistor 464, thereby establishing a minimum level of hysteresis. This is useful in the case of the absence of input data because it helps to prevent "chattering" of the output due to noise pulses. In a particular example of this circuit in which the data rate is 1.25 Gb/s, the time constant of the resistor 460 and the capacitor 462 is set to about 20 ns.

Differential data pulses are supplied to inputs 711, 713. The output signal in NRZ format is provided at complementary output terminals 752, 754 of the RS-FF 740 of the data regenerator 715. The output terminals 752, 754 are connected to the collectors of the transistors 731, 733.

In the case where the pulse amplitude of the data stream is measured directly, both the data regenerator 715 and the peak detector 721 are connected to the same differential data input. In this case the combined input impedance of the two receivers 715, 721 is, desirably, 50 Ω. Taking into account the emitter impedance of the grounded base amplifiers of the transistors 731, 733 and 773, 775, the input series resistance for the peak detector 721 is designed to be twice that of the connected data regenerator 715. In the example of a 50 ohm input impedance, the peak detector 721 input impedance is nominally 150 Ω and the data regenerator 715 input impedance is nominally 75 Ω, for a combined input impedance of 50 Ω. As a result, the current pulse induced in the data regenerator 715 is twice that of the related peak detector 721 and the peak detector 721 therefore accurately sets the hysteresis level such that the threshold of detection for the data regenerator 715 is precisely half the pulse amplitude. In this way the non-linearities of the peak detector 721 and data regenerator 715 cancel.

III-2. Second Embodiment

Figure 9:
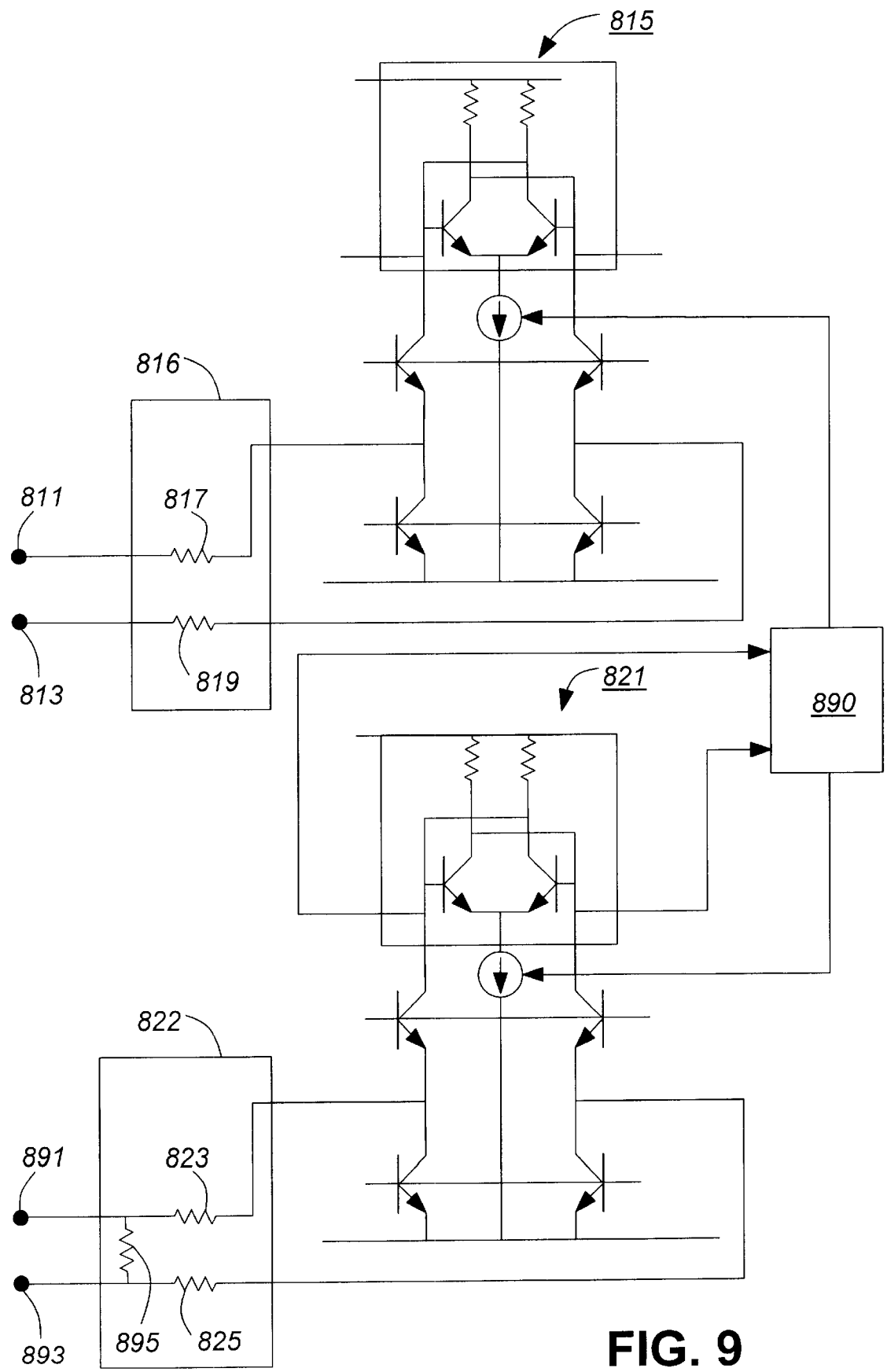
FIG. 9 is a circuit diagram of a data pulse receiver according to another embodiment of the present invention.

FIG. 9 shows a data pulse receiver according to another embodiment of the present invention. In FIG. 9, a data regenerator 815 and a peak detector 821 have the same circuits as the data regenerator 715 and the peak detector 721 shown in FIG. 8. The data regenerator 815 is connected to differential data input terminals 811, 813 via an input impedance network 816 including resistors 817, 819 of 50 Ω. The peak detector 821 is connected to differential clock input terminals 891, 893 via another input impedance network 822 including resistors 823, 825 of 100 Ω a resistor 895 of 200 Ω. The peak detector 821 is arranged to monitor the amplitude of a continuous clock stream of the same data rate and amplitude as the data pulses that are required to be regenerated. The outputs of the RS-FF of the peak detector 821 are connected to a current controller 890 which controls the tail currents of the current sink circuits of the data regenerator 815 and the peak detector 821. The current controller 890 has the same circuit as the controller 790 shown in FIG. 8.

In this case, different input signals are fed to the peak detector 821 and the data regenerator 815 and both the peak detector 821 and the data regenerator 821 are required to terminate the signals with, typically, 50 Ω. The requirement that the signal fed to the peak detector 821 is half the amplitude of that fed to the data regenerator 815 is in this case achieved by providing the peak detector 821 with a network of resistors which provide a 6 dB attenuation of the continuous clock input signal relative to the data pulse input signal, while at the same time terminating the input with a 50 ohm impedance. Such an input termination network is known and specific component values can be varied to achieve the same desired result. For example, the data pulse receiver can be terminated with a series 50 ohm resistor (taking into account the grounded base amplifier emitter impedance as before). The peak detector input resistor network could, for example, be comprised of three 33.3 ohm resistors arranged in a star network with one terminal connected to the emitter of the amplifier (and taking into account the emitter impedance), a second terminal connected to the signal input, and a third terminal connected to ac ground. The ac ground could be provided by connecting this third terminal to the third terminal of the corresponding network of the other differential input of the peak detector 821. An alternative and simpler arrangement for the peak detector input resistor network, as illustrated in FIG. 9, would be to provide a shunt 200 ohm resistor between the differential inputs and series 100 ohm resistors connected from the inputs to the emitters of the grounded base amplifier (taking into account the emitter impedance).

III-3. Third Embodiment

Figure 10:
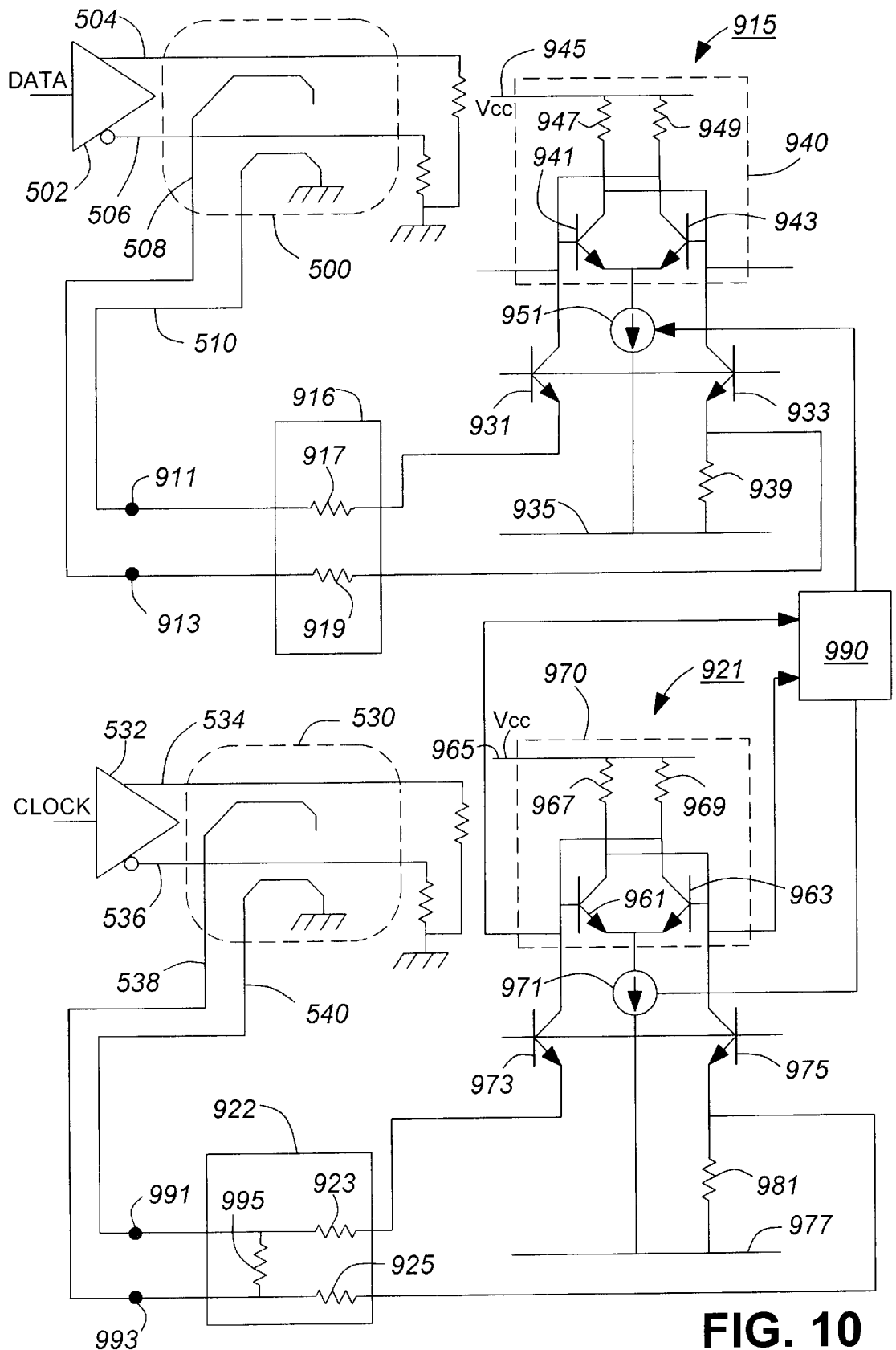
FIG. 10 is a circuit diagram of a data pulse receiver according to another embodiment of the present invention.

FIG. 10 shows a data pulse receiver according to another embodiment according to the present invention, the data pulse receiver including a Williamson coupler. The Williamson coupler operates with a high speed transmission medium including data and clock channels.

In FIG. 10, a typical data signal having continuous sequence of transitions is fed to a differential data driver 502 which transmits differential signals of data on transmission lines 504, 506 connected to a Williamson coupler 500. The coupler 500 detects the differential signals and provides differential data pulses on an open coupler output 508 and a dc grounded coupler output 510 which are connected to a pair of the differential data input terminals 911, 913. At the same time, the data signal is fed to another differential data driver 532 which transmits differential signals of clock on transmission lines 534, 536 connected to another Williamson coupler 530. The coupler 530 detects the differential signals and provides differential data pulses on an open coupler output 538 and a dc grounded coupler output 540 which are connected to another pair of differential clock input terminals 991, 993. The differential data input terminals 911, 913 are connected to a data regenerator 915 via an input impedance network 916 having resistors 917, 919 of 50 Ω. The differential clock input terminals 991, 993 are connected to a peak detector 921 via another input impedance network 922 having resistors 923, 925 of 100 Ω and a resistor 995 of 200 Ω.

The data regenerator 915 includes two transistors 931, 933, each forming a grounded base amplifier. The bases of the transistors 931, 933 are ac grounded and are typically biased at 1.3 volts dc by a dc voltage supplier (not shown). The emitter of the transistor 931 is connected to the differential data input terminal 911 via the resistor 917 of the impedance network 916. The emitter of the transistor 933 is connected to the differential data input terminal 913 via the resistor 919 of the network 919 and to the ground terminal 935 via a bias resistor 939 of 50 Ω. The data regenerator 915 includes an RS-FF 940 having emitter coupled transistors 941, 943, the collectors of which are connected to a voltage terminal 945 of dc supply voltage Vcc via load resistors 947, 949, respectively. The RS-FF 940 formed by the load resistors 947, 949 in combination with the transistors 941, 943 reconverts an RZ pulse signal to an NRZ format output signal. The emitters of the transistors 941, 943 are connected to a current sink circuit 951 for providing a tail current to the RS-FF 940.

The peak detector 921 includes emitter coupled transistors 961, 963, the collectors of which are connected to a voltage terminal 965 of the dc supply voltage Vcc via load resistors 967, 969, respectively. The transistors 961, 963 and the resistors 967, 969 form an RS-FF 970. The coupled emitters of the transistors 961, 963 are connected to a current sink circuit 971 for providing a tail current. Two transistors 973, 975, each form a grounded base amplifier. The bases of the transistors 973, 975 are ac grounded and are typically biased at 1.3 volts dc by a dc voltage supplier (not shown). The emitter of the transistor 973 is connected to the differential clock input terminal 991 via the resistor 923 of the impedance network 922. The emitter of the transistor 975 is connected to the differential clock input terminal 993 via the resistor 925 of the network 922 and to the ground 977 via a bias resistor 981 of 150 Ω. The collectors of the transistors 973, 975 (i.e., the outputs of the RS-FF 921) are connected to a current controller 990 which controls the currents of the current sink circuits 951, 971. The current controller 990 has the same circuit as the controller 790 shown in FIG. 8.

In the data pulse receiver, the arrangement can be modified to apply to any number of data regenerator pulse receivers whose hysteresis level is set by a single peak detector circuit monitoring a continuous clock input signal as disclosed in U.S. application Ser. No. 09/071,117.

III-4. Others

All of the arrangements described above and illustrated in FIGS. 7 and 8 assume that the backplane coupler circuits connected to the pulse receiver inputs have no dc path to ground, and consequently as illustrated in these Figures the bias current for the grounded base amplifiers is provided by current sinks, such as bipolar current mirrors. However, in principle, these arrangements can also be applied to the case when the backplane microwave coupler circuits are terminated on the pulse receiver side with a 50 Ω termination resistor. In this latter scheme, the current sinks providing the bias current for the grounded base amplifiers are not necessary.

None of the arrangements described above preclude the possibility of applying these improvements to the input circuit arrangements described in U.S. application Ser. No. 09/054,440. It provides for a unique coupler arrangement in which one half of the differential coupler is shorted to ground, while the other side is left floating. Thus one side of the differential input signals has a dc path to ground, while the other half is dc open-circuit. This type of coupler arrangement is known as the Williamson coupler, and is characterized by its ability to cancel unwanted pulse signal reflections. In U.S. application Ser. No. 09/054,440, the bias current for the floating input is provided by a resistor from the associated emitter to ground which balances the dc path through the termination resistor of the dc shorted input. To accommodate this arrangement according to the present invention, one possible solution is illustrated in FIG. 10. Note that the dc impedance to ground from the emitters of the receivers is balanced, providing balanced bias currents to the grounded base amplifiers. Also, the impedance to ground from the emitters of the data regenerator is half that of the peak detector.

Figure 11:
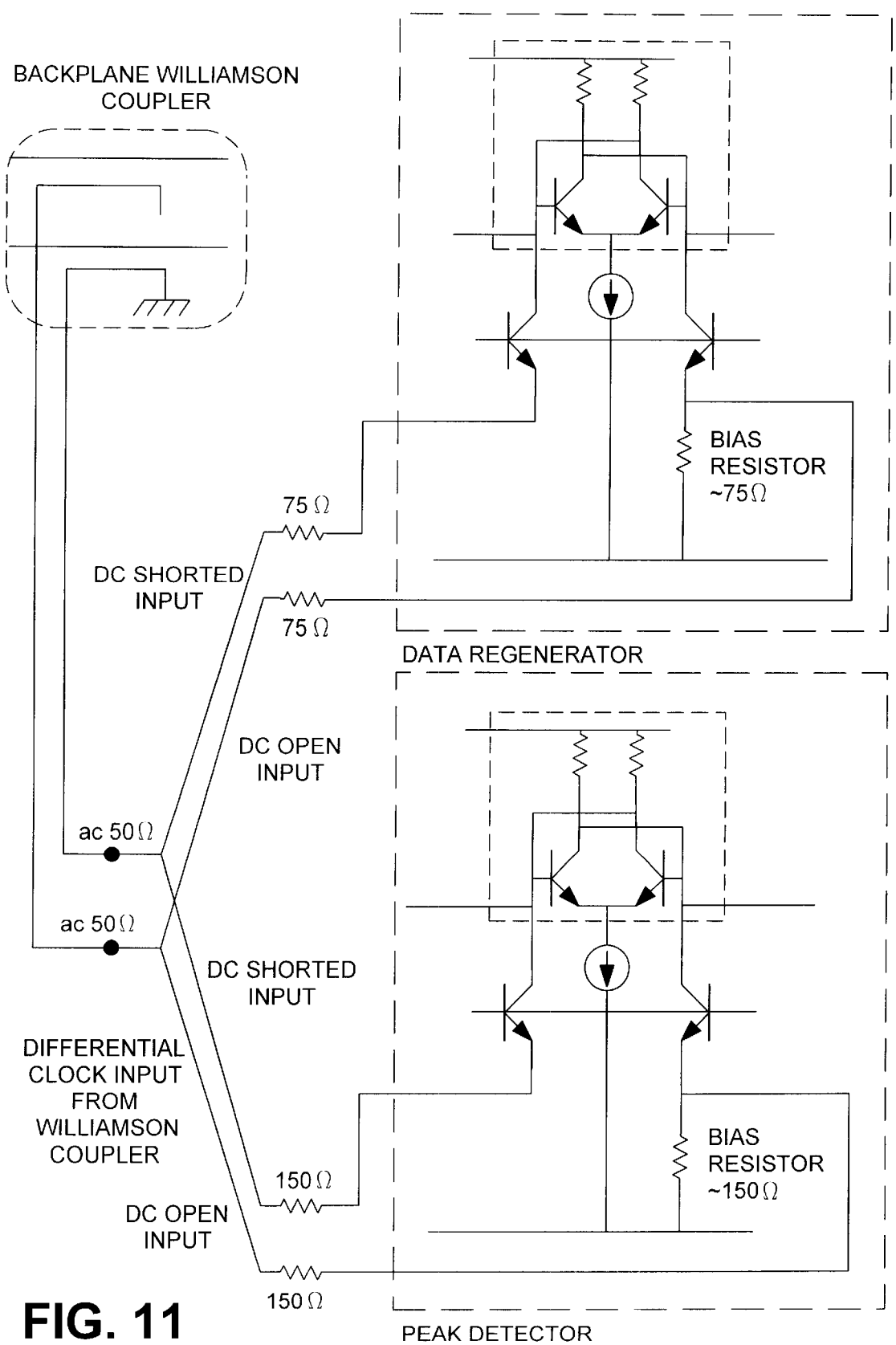
FIG. 11 is a circuit diagram of a data pulse receiver according to another embodiment of the present invention.

Another possible arrangement for the Williamson coupler is illustrated in FIG. 11. In this case the peak detector monitors the amplitude of the data pulse directly, or, if the input is a continuous clock, the regenerator regenerates the clock signal. As with the previous example, the dc impedance to ground from both grounded base amplifiers is balanced, providing balanced bias currents to the grounded base amplifiers. In this arrangement, the resistances of bias resistors of a data regenerator and a peak detector are 75 Ω and 150 Ω, respectively. The resistances are designed to provide equal bias current to the transistors of the grounded base amplifiers. The dc bias of the grounded base amplifier of the peak detector is half that of the grounded base amplifier of the data regenerator, but this is of no consequence, since the pulse magnitude of each is in the same 1:2 ratio. The tail currents for the data regenerator and the peak detector are identical, thereby ensuring precise cancellation of non-linear effect.

Although particular embodiments of the present invention have been described in detail, it should be appreciated that numerous variations, modifications, and adaptations may be made without departing from the scope of the present invention as defined in the claims. Types of the bipolar transistors and FETs may be inverse to opposite types for appropriate applications.

What is claimed is:

1. A data pulse receiver responsive to a clocked data signal having a continuous sequence of tansitions, the data pulse receiver comprising:

data regeneration means for providing a hysteresis to regenerate data in response to a first input signal derived from the clocked data signal, the data regeneration means comprising:
- (i) a first differential amplifier including first and second transistors, the bases of which are ac grounded; and
- (ii) first hysteresis means including third and fourth transistors, the bases of which are connected to the collectors of the first and second transistors, operating current of the first hysteresis means being provided by a first current circuit, the first hysteresis means operating in response to first differential input signals fed to the emitters of the first and second transistors, the first differential input signals being derived from the first input signal;

level detection means for detecting a signal level of a second input signal derived from the clocked data signal; and control means for adjusting the hysteresis of the data regeneration means in response to the signal level detected by the level detection means.

2. The data pulse receiver of claim 1, wherein the level detection means comprises:

a second differential amplifier including fifth and sixth transistors, the bases of which are ac grounded; and second hysteresis means including seventh and eighth transistors, the bases of which are connected to the collectors of the fifth and six transistors, operating current of the second hysteresis means being provided by a second current circuit, the second hystesis means operating in response to second differential input signals fed to the emitters of the fifth and sixth tansistors, the second differential input signals being derived from the second input signal, the second hysteresis means providing an output voltage as the signal level detected by the level detection means.

3. The data pulse receiver of claim 2, wherein the control means comprises:

means for comparing the output voltage of the second hysteresis to a reference voltage to provide a comparison output; and adjust means for adjusting the currents of the first and second current circuits in response to the comparison output.

4. The data pulse receiver of claim 3, wherein the adjust means comprises first and second mirror means for varying the currents of the first and second current circuits, the mirror rates of the first and second mirror means being essentially equal, the currents of the first and second current circuits being essentially equal.

5. The data pulse receiver of claim 4, wherein:

the data regeneration means further comprises third and fourth current circuits which are connected to the first and second transistors, respectively, of the first differential amplifier; and the level detection means further comprises fifth and sixth current circuits which are connected to the fifth and sixth transistors of the second differential amplifier.

6. The data pulse receiver of claim 5, further comprising:

a first pair of first and second input terminals for commonly receiving the first and second differential input signals;

a first input impedance network for transferring the first differential input signal received at the first and second input terminals to the data regeneration means; and a second impedance network for transferring the second differential input signal received at the first and second input terminals to the level detection means, the input impedances of the first and second input terminals being essentially equal.

7. The data pulse receiver of claim 6, wherein:

the first input impedance network comprising first and second impedance elements, the first impedance element being connected between the first input terminal and the emitter of the first transistor, the second impedance element being connected between the second input terminal and the emitter of the second transistor; and the second input impedance network comprising third and fourth impedance elements, the third impedance element being connected between the first input terminal and the emitter of the fifth transistor, the fourth impedance element being connected between the second input terminal and the emitter of the sixth transistor.

8. The data pulse receiver of claim 7, wherein:

each of the first and second impedance elements comprises a resistance element having a first resistance; and each of the third and fourth impedance elements comprises a resistance element having a second resistance, the second resistance being twice of the first resistance.

9. The data pulse receiver of claim 8, wherein the first and second resistances are 75 $\Omega$ and 150 $\Omega$, respectively, the input impedances of the first and second input terminals being 50 $\Omega$.

10. The data pulse receiver of claim 5, further comprising:

a second pair of third and fourth input terminals for receiving a differential data input signal as the first differential input signal, the differential data input signal being derived from the clocked data signal; and a third pair of fifth and sixth input terminals for receiving a differential clock signal as the second differential input signal.

11. The data pulse receiver of claim 10, further comprising:

a third input impedance network for transferring the differential data input signal to the data regeneration means; and a fourth input impedance network for transferring the differential clock signal to the data regeneration means, the input impedances of the third–sixth input terminals being essentially equal.

12. The data pulse receiver of claim 11, wherein:

the third input impedance network comprises fifth and sixth impedance elements, the fifth impedance element being connected between the third input terminal and the emitter of the first transistor, the sixth impedance element being connected between the fourth input terminal and the emitter of the second transistor; and the fourth input impedance network comprises seventh, eighth and ninth impedance elements, the seventh impedance element being connected between the fifth input terminal and the emitter of the fifth transistor, the eighth impedance element being connected between the sixth input terminal and the emitter of the sixth transistor, the ninth impedance element being connected between the fifth and sixth input terminals.

13. The data pulse receiver of claim 12, wherein each of the fifth and sixth impedance elements comprises a 50 ohm resistance element, each of the seventh and eighth impedance elements comprises a 100 ohm resistance element, and the ninth impedance element comprises a 200 ohm resistance element, the input impedances of the first–fourth input terminals being 50 Ω.

14. The data pulse receiver of claim 4, wherein:

the data regeneration means further comprises a third current circuit which is connected to the second transistors of the first differential amplifier; and the level detection means further comprises a fourth current circuit which is connected to the sixth transistor of the second differential amplifier.

15. The data pulse receiver of claim 14, further comprising:

a fourth pair of seventh and eighth input terminals for receiving a differential data input signal via first signal coupling means as the first differential input signal; and a fifth pair of ninth and tenth input terminals for receiving a differential clock signal via second coupling means as the second differential input signal.

16. The data pulse receiver of claim 15, wherein each of the first and second coupling means comprises a Williamson coupler which detects the respective differential signal and provides differential data pulses on an open coupler output and a dc grounded coupler output.

17. The data pulse receiver of claim 16, further comprising:

a fifth input impedance network for transferring the differential data input signal to the data regeneration means; and a sixth input impedance network for transferring the differential clock signal to the level detection means.

18. The data pulse receiver of claim 17, wherein:

the fifth input impedance network comprises tenth and eleventh impedance elements, the tenth impedance element being connected between the seventh input terminal and the emitter of the first transistor, the eleventh impedance element being connected between the eighth input terminal and the emitter of the second transistor; and the sixth input impedance network comprises twelfth, thirteenth and fourteenth impedance elements, the twelfth impedance element being connected between the ninth input terminal and the emitter of the fifth transistor, the thirteenth impedance element being connected between the fourth input terminal and the emitter of the sixth transistor, the fourteenth impedance element being connected between the tenth and fourth input terminals.

19. The data pulse receiver of claim 18, wherein each of the tenth and eleventh impedance elements comprises a 50 ohm resistance element, each of the twelfth and thirteenth impedance elements comprises a 100 ohm resistance element, and the fourteenth impedance element comprises a 200 ohm resistance element, the input impedances of the first–fourth input terminals being 50 Ω.

* * * * *

UNITED STATES PATENT AND TRADEMARK OFFICE
CERTIFICATE OF CORRECTION

PATENT NO.    : 6,529,564 B1                                    Page 1 of 1
DATED         : March 4, 2003
INVENTOR(S)   : Brown, Anthony K.D.

It is certified that error appears in the above-identified patent and that said Letters Patent is hereby corrected as shown below:

Column 4,
Line 59, "$10_{-14}$" should read -- $10^{-14}$ --.

Column 14,
Line 66, "tansitions" should read -- transitions --.

Column 15,
Line 33, "tansistors" should read -- transistors --.

Signed and Sealed this

Fourteenth Day of October, 2003

JAMES E. ROGAN
*Director of the United States Patent and Trademark Office*